(12) United States Patent
Liu et al.

(10) Patent No.: US 9,174,837 B2
(45) Date of Patent: Nov. 3, 2015

(54) SYSTEM AND METHOD FOR DETECTING SURFACE CHARGES OF A MEMS DEVICE

(75) Inventors: Fang Liu, Woburn, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 888 days.

(21) Appl. No.: 13/435,236

(22) Filed: Mar. 30, 2012

(65) Prior Publication Data

US 2013/0257456 A1 Oct. 3, 2013

(51) Int. Cl.
*G01R 27/26* (2006.01)
*G01L 9/00* (2006.01)
*B81B 7/00* (2006.01)
*G01R 29/24* (2006.01)

(52) U.S. Cl.
CPC ............ *B81B 7/008* (2013.01); *B81B 2207/03* (2013.01); *G01R 29/24* (2013.01)

(58) Field of Classification Search
CPC ..... B81B 7/008; B81B 2207/03; G01R 29/24
USPC ................................................. 324/658–690
See application file for complete search history.

(56) References Cited

U.S. PATENT DOCUMENTS

| | | | |
|---|---|---|---|
| 5,939,633 A | 8/1999 | Judy | 73/514.32 |
| 6,505,511 B1 | 1/2003 | Geen et al. | 73/504.12 |
| 6,869,815 B2 | 3/2005 | Gasparyan et al. | 438/29 |
| 7,015,056 B2 | 3/2006 | Gasparyan et al. | 438/29 |
| 7,364,942 B2 | 4/2008 | Martin | 438/106 |
| 7,625,773 B2 | 12/2009 | Lutz et al. | 438/50 |
| 2004/0185284 A1 | 9/2004 | Ho et al. | 428/500 |
| 2007/0069759 A1 | 3/2007 | Rzepiela et al. | 324/765 |
| 2007/0109003 A1 | 5/2007 | Shi et al. | 324/755 |
| 2009/0132188 A1 | 5/2009 | Watanabe | 702/64 |
| 2012/0229153 A1* | 9/2012 | Dawson et al. | 324/691 |

FOREIGN PATENT DOCUMENTS

WO  WO 2007/022538 A2  2/2007

OTHER PUBLICATIONS

Jiang et al. "Electrical charge trapping at defects on the Si(111)7×7 surface," *Appl. Phys. Lett.*, vol. 88, No. 6, pp. 061909-1-061909-3 (2006).

* cited by examiner

*Primary Examiner* — Melissa Koval
*Assistant Examiner* — Farhana Hoque
(74) *Attorney, Agent, or Firm* — Sunstein Kann Murphy & Timbers LLP

(57) ABSTRACT

A method for measuring retained surface charges within a MEMS device includes performing an initial voltage sweep on the MEMS device, and recording the capacitance between a first and second electrode of the MEMS device. The method may then (1) apply a stress signal to the MEMS device that causes a first and/or second electrode within the MEMS device to retain a surface charge, and (2) perform at least one additional voltage sweep on the MEMS device. The method may record the capacitance during the additional voltage sweep(s), and calculate a C-V center voltage shift based upon the data obtained during the initial voltage sweep and additional voltage sweep. The voltage shift is representative of the retained surface charge.

27 Claims, 4 Drawing Sheets

(a) Side view of the apparatus

*FIG. 1A*

(a) Side view of the apparatus

*FIG. 1C*

(c) Example of the electrode configuration -asymmetric electrodes (side view)

*FIG. 1B*

(b) Example nof teh electrode configuration -comb drive (top view)

SYSTEM AND METHOD FOR DETECTING SURFACE CHARGES OF A MEMS DEVICE

TECHNICAL FIELD

The present invention relates to MEMS devices, and more particularly to devices for determining and characterizing surface charges within a MEMS device.

BACKGROUND ART

Microelectromechanical systems ("MEMS") are used in a growing number of applications. For example, MEMS currently are implemented as gyroscopes to detect pitch angles of airplanes, and as accelerometers to selectively deploy air bags in automobiles. In simplified terms, many such MEMS devices often have a structure suspended above a substrate, and associated circuitry that both senses movement of the suspended structure and delivers the sensed movement data to one or more external devices (e.g., an external computer). The external device processes the sensed data to calculate the property being measured (e.g., pitch angle or acceleration).

When a voltage is applied to a MEMS device, a surface charge may build up within the MEMS device (e.g., within a surface of the capacitor of the MEMS). This surface charge can impact the performance and accuracy of the MEMS device by redistributing the electric field. This redistribution of the electric field can cause the performance of the device to drift, and can severely restrict the range of stable operation of some MEMS devices. In more severe instances, the trapped surface charges can cause stiction and device failure.

Prior attempts to measure the surface charge have utilized Klein probe force microscopy (KPFM). However, the KPFM technique is destructive (e.g., the MEMS device is destroyed during testing), and has a very low scan rate. Other prior art methods measure the charge/discharge current of a battery, but are not sensitive enough to measure the surface change within a MEMS device.

SUMMARY OF THE EMBODIMENTS

A first embodiment of the invention involves a method for measuring a retained surface charge within a MEMS device. The MEMS device may include a first and second electrode (e.g., separated by an air gap). The method may first perform an initial signal sweep on the MEMS device by applying a first force signal to the MEMS device and gradually changing the applied first force signal. By changing the first force signal, the method may change a gap between the first and second electrode which, in turn, causes a capacitance change.

After performing the initial signal sweep, the method may (1) apply a stress signal to the MEMS device for a pre-determined amount of time, and (2) perform at least one additional signal sweep on the MEMS device. The stress signal may cause the first and/or second electrode to retain a surface charge. To perform the additional signal sweep(s), the method may apply a second force signal to the MEMS device and gradually change the applied second force signal which, in turn, changes the capacitance between the first and second electrode. The method may then calculate a signal shift based upon the data obtained from the initial signal sweep and the additional signal sweep(s). The signal shift may be representative of the retained surface charge. The first and second force signals may be voltages.

In some embodiments, performing the initial signal sweep and the at least one additional signal sweep may include increasing the applied first force signal and applied second force signal from a minimum signal to a maximum signal. Additionally, performing the initial signal sweep may also include decreasing the applied first force signal to the minimum signal after reaching the maximum signal. Similarly, performing the at least one additional signal sweep may include decreasing the applied second force signal to the minimum signal after reaching the maximum signal. Furthermore, calculating the signal shift may include (1) calculating a first signal shift based upon data obtained as the applied second force is increased during the at least one additional signal sweep, (2) calculating a second signal shift based upon data obtained as the applied second force is decreased during the at least one additional signal sweep, and (3) averaging the first and second signal shifts to obtain an average signal shift.

The first and second electrodes may include a coating, and the surface charge may be retained in the coating. For example, the coating may be an anti-stiction coating and/or a dielectric material coating. Additionally, the absolute value of the stress signal may be less than a pull-in voltage of the first and second electrodes.

In some embodiments, performing the initial signal sweep and the at least one additional signal sweep may include decreasing the applied first signal and applied second signal from a maximum signal to a minimum signal. Additionally, performing the initial signal sweep may also include increasing the applied first force signal to the maximum signal after reaching the minimum signal, and performing the at least one additional signal sweep may include increasing the applied second force signal to the maximum signal after reaching the minimum signal. Calculating the signal shift may include (1) calculating a first signal shift based upon data obtained as the applied second force is decreased during the at least one additional signal sweep, (2) calculating a second signal shift based upon data obtained as the applied second force is increased during the at least one additional signal sweep, and (3) averaging the first and second signal shifts to obtain an average signal shift.

In accordance with further embodiments, a method for characterizing surface charges within a MEMS device may include (1) applying a force signal to the MEMS device, (2) gradually changing the applied force signal, (3) applying a stress signal to the MEMS device for a pre-determined amount of time to cause the first and second electrodes within the MEMS device to retain a surface charge, (4) repeating steps 1-3 (e.g., a pre-determined number of times, for example, at least five times), and (5) calculating a signal shift based upon the data obtained from step (2). The applied force signal may create a capacitance between the first and second electrodes, and gradually changing the applied force signal may change the capacitance between the electrodes. The signal shift may be representative of the retained surface charge.

The first and/or second electrode may include a coating (e.g., an anti-stiction coating and/or a dielectric material coating), and the surface charge may be retained in the coating. The absolute value of the stress signal may less than a pull-in voltage of the first and second electrodes (e.g., to prevent the electrodes from contacting one another).

In some embodiments, calculating a voltage shift may include plotting the change in capacitance against the applied signal data to obtain a hysteresis plot for each of the pre-determined number of times. The signal shift may be the distance of a center point of the hysteresis plot from a zero signal point. Gradually changing the force signal may include increasing the force signal to a maximum signal, and the method may include gradually decreasing the applied force signal once the force signal has reached the maximum signal. In such embodiments, calculating a signal shift may include (1) calculating a first signal shift based upon data obtained as the applied force signal is increased, (2) calculating a second signal shift based upon data obtained as the applied force signal is decreased, and (3) averaging the first and second signal shifts to obtain an average signal shift. Repeating steps 1-3 for a pre-determined number of times may include repeating the steps at least five times, and the stress signal and pre-determined amount of time may be varied for each of the number of times. Additionally, the method may include calculating a signal shift for each of the predetermined number of times.

In accordance with additional embodiments, a test system may include a MEMS capacitor, a signal generator, and a signal monitor. The MEMS capacitor may have a first electrode and a second electrode that are separated by an air gap. The signal generator may be configured to perform at least one signal sweep and apply a stress signal to the MEMS capacitor. The signal sweep may include applying and gradually changing a force signal to the MEMS capacitor which, in turn, changes a capacitance between the first and second electrode. The stress signal may cause at least one of the first and second electrodes to retain a surface charge. The signal generator may apply the stress signal to the MEMS device for a pre-determined amount of time.

The signal monitor may be configured to measure the capacitance between the first and second electrode as the applied force signal is increased, and may be configured to communicate with a data analysis device. The data analysis device may be configured to calculate a signal shift based, at least in part, upon the applied force signal and the capacitance measured by the signal monitor. The signal shift may be representative of the retained surface charge. The MEMS capacitor, the signal generator, and the signal monitor may be located on the same chip. The first and/or second electrodes may include a coating (e.g., an anti-stiction coating and/or a dielectric material coating), and the surface charge may be retained in the coating.

In some embodiments, the signal sweep may be an increasing signal sweep, and the signal generator may gradually increase the applied force signal to a maximum signal. The signal generator may also be configured to perform a decreasing signal sweep by gradually decreasing the applied force signal once the force signal has reached the maximum signal. The signal monitor may also be configured to measure the capacitance between the first and second electrodes during the decreasing signal sweep. The test system may include the data analysis device.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

In illustrative embodiments, a charge test apparatus characterizes charges that may be retained within the electrodes (or surface coatings on the electrodes) of a MEMS device (e.g., a MEMS accelerometer, gyroscope, etc.). By characterizing this retained charge, various embodiments of the present invention are able to compensate for drifting caused by the retained charge, and improving the accuracy of the MEMS device. Details of illustrative embodiments are discussed in greater detail below.

MEMS devices such as MEMS accelerometers and gyroscopes employ capacitors with multiple electrodes to measure a force that is applied to the MEMS device. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference.

Figure 1A:
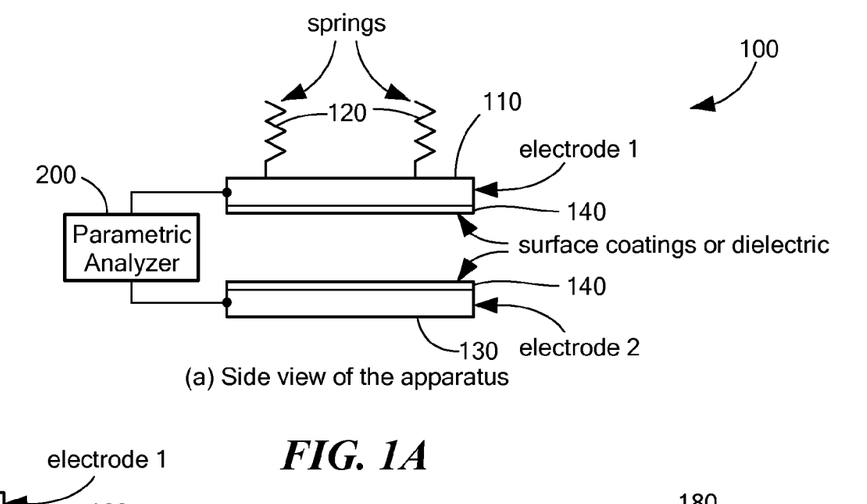
FIG. 1A schematically shows a side view of a MEMS device with two electrodes, in accordance with illustrative embodiments of the present invention.

For example, as shown in FIG. 1A, the MEMS device 100 can have a first electrode 110 (e.g., a moveable mass) mounted to a substrate (not shown) via one or more springs 120 that allow the first electrode 110 to move when a force is applied. Additionally, the MEMS device 100 also has a stationary electrode 130. As the name suggests, the stationary electrode 130 does not move relative to the underlying device (e.g., the automobile), even when a force is applied. As discussed in greater detail below, each of the electrodes (e.g., the moveable electrode 110 and the stationary electrode 130) can have an anti-stiction surface coating or dielectric material coating.

When a force is applied to the MEMS device (e.g., to the substrate and the stationary electrode 130), the moveable electrode 110 will move relative to the stationary electrode 130. If the applied force causes the moveable electrode 110 to move closer to the stationary electrode 130, the capacitance between the electrodes 110 increases (e.g., capacitance is inversely proportional to the distance between the electrodes). If the force causes the moveable electrode 110 to move away from the stationary electrode 130, then the capacitance decreases.

Figure 1B:
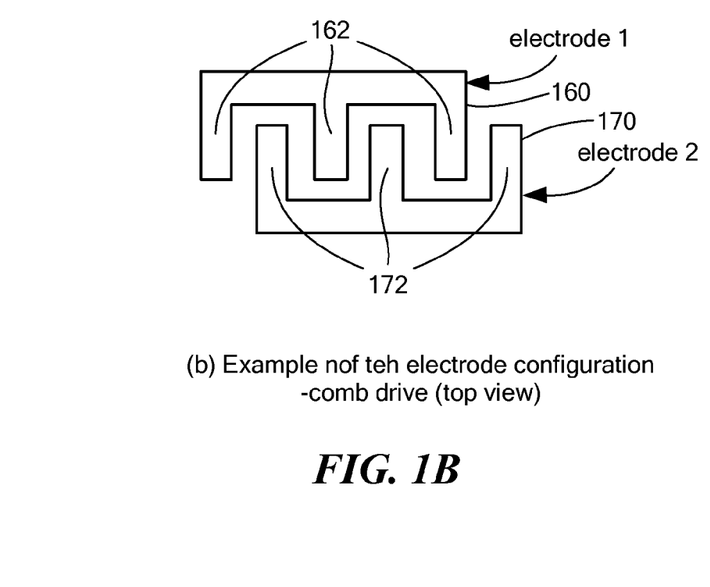
FIG. 1B schematically shows a top view of MEMS device with an alternative electrode configuration, in accordance with additional embodiments of the present invention.
Figure 1C:
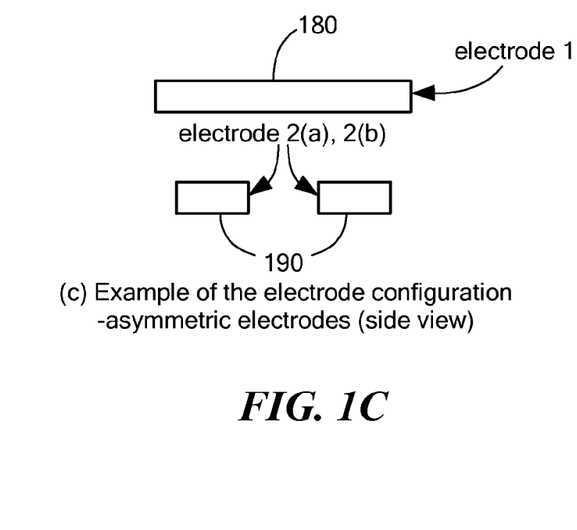
FIG. 1C schematically shows a side view of MEMS device with a third electrode configuration, in accordance with additional embodiments of the present invention.

Although the variable capacitor is described above as having a moveable electrode 110 (e.g., a moveable plate) and a stationary electrode 130 (e.g., a stationary plate), some embodiments of the present invention can utilize different variable capacitors. For example, each of the electrodes 110/130 may be moveable (e.g., the electrode 130 may be moveable along with the moveable electrode 110). Alternatively, as shown in FIG. 1B, the capacitor can have electrodes 160/170 with a plurality of inter-digitated fingers 162/172. In such embodiments, the change in capacitance may be based upon the change in overlapping areas between the inter-digitated fingers 162/172. Furthermore, as shown in FIG. 1C, some embodiments of the present invention may utilize variable capacitors having asymmetric electrodes 180/190.

Figure 2:
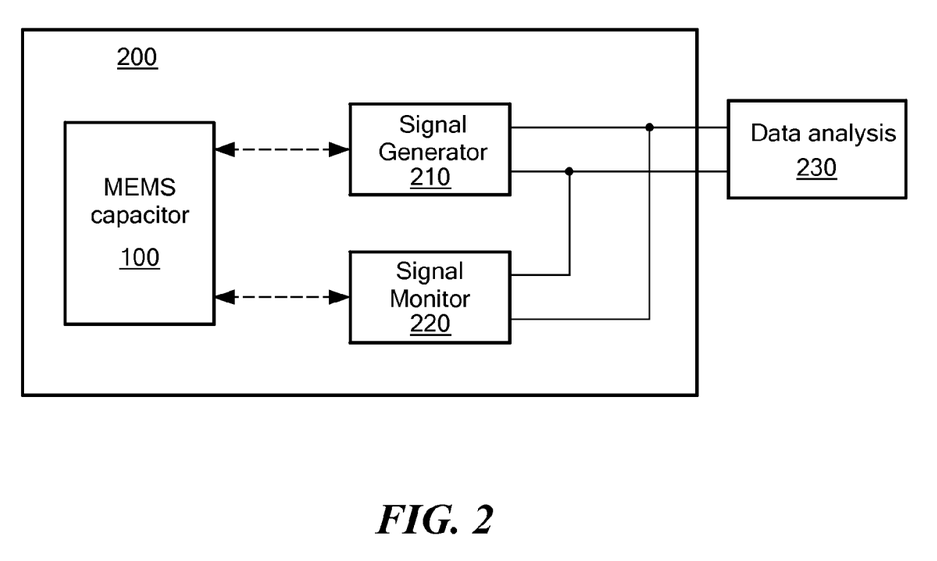
FIG. 2 schematically shows a charge test apparatus in accordance with some embodiments of the present invention.

As mentioned above, various embodiments of the present invention can detect and characterize surface charges that may build up on the surface of the electrodes 110/130 (or within the surface coatings 140). To that end, some embodiments may include a parametric analyzer 200 that may be used to characterize the retained surface charge. As shown in FIG. 2, the analyzer 200 may include a signal generator 210 and a signal monitor 220. Both the signal generator 210 and the signal monitor 220 may be electrically connected to the MEMS capacitor 100 and an off-chip or on-chip data analysis device 230.

As the name suggests, the signal generator 210 can generate a signal and apply a force (e.g., a voltage) to the MEMS capacitor 100. As discussed above, as the force is applied to the MEMS capacitor 100, the electrodes 110/130 will move relative to one another (e.g., the moveable electrode 110 can move closer to or further away from the stationary electrode 130). As the distance between the electrodes 110/130 changes, so will the capacitance. Additionally, as discussed in greater detail below, the signal generator 210 can also apply a "stress signal" to the MEMS capacitor. Specifically, this stress signal can "inject" a charge into the electrodes 110/130 and/or surface coatings 140. In other words, the stress signal generated by the signal generator 210 can create a charge that is retained and/or builds up within the electrodes 110/130 and/or surface coatings 140.

As the signal generator 210 applies the force and stress signals to MEMS capacitor, the signal monitor can monitor and record the voltage applied to the MEMS capacitor, and the changes in the capacitance as the electrodes 110/130 move relative to one another. The signal monitor 210 can also transfer the recorded data to the data analyzer 230 which, as discussed in greater detail below, analyzes the force and capacitance data to determine and characterize any charge that builds up within the electrodes 110/130 and/or surface coatings 140. In some embodiments, the data analyzer 230 can plot the capacitance and voltage data to obtain representative C-V curves (discussed in greater detail below).

Figure 3:
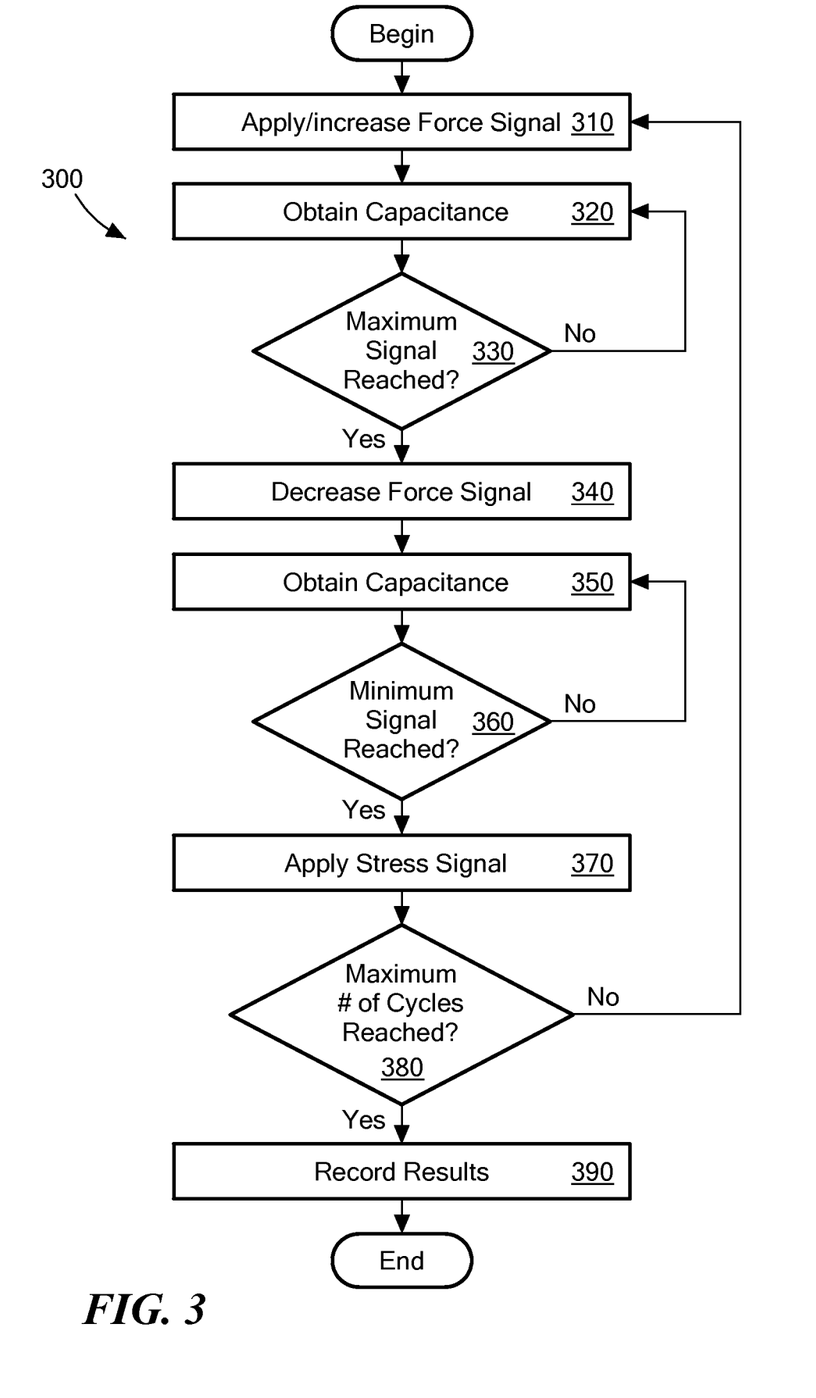
FIG. 3 shows a flowchart depicting a method of characterizing a retained surface charge, in accordance with additional embodiments of the present invention.

FIG. 3 shows one embodiment of a method in accordance with the present invention. According to the method 300, the signal generator 210 (FIG. 2) can perform an initial voltage sweep (e.g., to obtain a baseline measurement) of the MEMS capacitor by applying a force signal (e.g., a voltage or a current) to the MEMS capacitor and gradually increasing the voltage (Step 310). As mentioned above, as the applied voltage is increased, the capacitance between the electrodes 110/130 will change (e.g., as the changing force/voltage causes the electrodes 110/130 to move relative to one another). As the capacitance changes, the signal monitor 220 can monitor and record the capacitance between the electrodes 110/130 (Step 320). The signal generator can continue to increase the force/voltage until a maximum signal is reached (Step 330).

Although the actual voltages can vary from MEMS device to MEMS device and application to application, in order to obtain a full "sweep" of the MEMS device, the signal generator 210 can begin the voltage sweep at a voltage that is below the "pull-out voltage" of the MEMS capacitor 100 and gradually increase the signal to a voltage that is above the "pull in voltage" of the MEMS capacitor 100. As used herein, the term "pull-in voltage" refers to the voltage at which the balance between the electrostatic force of the electrodes and the spring force becomes unstable and the two electrodes 110/130 collapse and contact one another. After collapsing, the sum of the electrostatic force and the adhesion force between two touching surfaces (e.g., the surfaces of the electrodes) is higher than the spring force due to the shorter distance (e.g., no distance) between the electrodes 110/130. Similarly, the term "pull-out voltage" refers to the voltage at which the spring force is restored and is higher than the sum of the electrostatic force and the adhesion force, and the electrodes 110/130 once again separate from one another. In illustrative embodiments, these voltages are different.

After reaching the maximum voltage (e.g., Step 330 mentioned above), in some embodiments, the signal generator 210 can then gradually decrease the applied force signal (e.g., the applied voltage) (Step 340), and the signal monitor 220 can monitor/record the changes in capacitance between the electrodes 110/130 as the force signal is decreased (Step 350). The signal generator 210 can continue decreasing the force signal until it reaches a minimum signal/voltage (e.g., the signal/voltage that the signal generator started at in Step 310) (Step 360). It is important to note that the steps of decreasing the force signal to the minimum signal (e.g., Steps 340, 350, and 360) are optional and some embodiments of the present invention only perform the steps of increasing the force signal (e.g., steps 310, 320, and 330).

It is important to note that, in some embodiments, the voltage sweeps may be performed in a different order from that described above. For example, the initial voltage sweep may start from the maximum voltage, and the signal generator 210 may gradually decrease the applied force signal until it reaches the minimum voltage. The signal generator 210 may then gradually increase the applied force signal until it reaches the maximum voltage (e.g., the steps of 310/320 and 340/350 may be reversed). In such embodiments, the steps of increasing the applied signal to the maximum voltage may be optional.

Figure 4A:
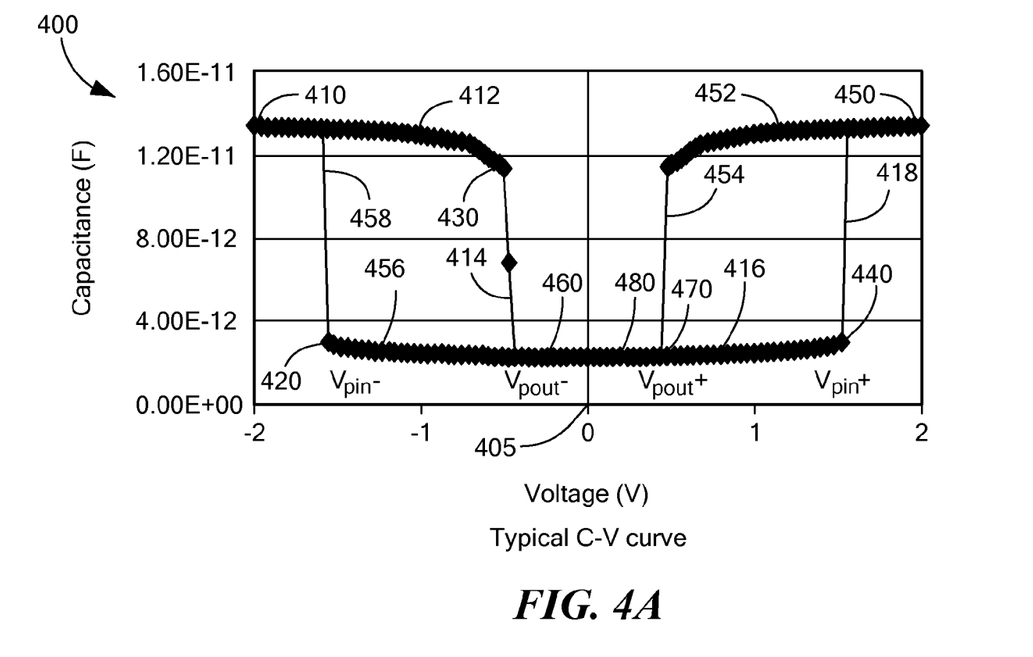
FIGS. 4A and 4B schematically show capacitance-voltage curves for a MEMS device in accordance with embodiments of the present invention.

FIG. 4A shows an exemplary capacitance-voltage curve (C-V curve) (e.g., as plotted by the data analyzer 230) showing the changes in capacitance between the electrodes 110/130 as the voltage is increased to the maximum (e.g., Steps 310, 320, and 330), and then decreased to the minimum (e.g., Steps 340, 350, and 360). As mentioned above, the signal generator 210 can begin the initial voltage sweep by applying a minimum voltage (point 410 on the C-V curve), and may gradually increase the applied force signal. In the C-V curve shown in FIG. 4A, the minimum voltage is a negative voltage (e.g., −2 volts) below the pull-in voltage 420. Therefore, at the minimum voltage, the electrodes 110/130 are collapsed and contacting one another, as described above. As the signal generator 210 gradually increases the force signal, the capacitance will gradually decrease (section 412 of the C-V curve) until it reaches the pull-out voltage 430. At the pull-out voltage, the balance between the electrostatic force and the spring force is restored, and the electrodes 110/130 will separate from one another causing a sharp drop in the capacitance (e.g., section 414 of the C-V curve 400).

As the force signal is increased further, the capacitance will continue to decrease until the voltage crosses the zero point 405 (e.g., section 460 of the C-V curve 400). Once the voltage crosses the zero point 405, the capacitance will begin to gradually increase with the increasing voltage (e.g., section 416 of the C-V curve) until the applied force signal reaches the pull-in voltage 440. Once the force signal reaches the pull-in voltage 440, there will be a sharp increase in the capacitance (section 418 of the C-V curve 400) as the electrodes collapse and touch one another. There will then be a gradual increase in the capacitance as the signal generator 210 continues to increase the force signal to the maximum voltage 450.

As mentioned above, in some embodiments, the voltage sweep can also be performed in reverse (e.g., the signal generator 210 can decrease the force signal from the maximum voltage 450 to the minimum voltage 410). In such embodiments, the capacitance will gradually decrease (section 452 of the C-V curve 400) with the force signal until the force signal reaches the pull-out voltage (point 470 on the C-V curve 400) of the MEMS capacitor (e.g., the electrodes 110/130 will be in contact with one another because the maximum force signal is above the pull-in voltage 470), at which point, there will be a sharp drop in the capacitance as the electrodes 110/130 separate from one another (section 454 of the C-V curve). As the force signal is decreased further (e.g., below the pull-out voltage 470), the capacitance will decrease slightly (section 480 of the C-V curve) until the voltage crosses the zero point 405 (the point at which the voltage changes from a positive voltage to a negative voltage), at which point the capacitance will gradually begin to increase (section 456) until the force signal reaches the pull-in voltage 420. When the force signal reaches the pull-in voltage 420, the electrodes 110/130 will once again collapse and touch one another, causing a sharp increase in the capacitance (section 458). The capacitance will then, once again, increase gradually until the minimum force signal 410 is reached.

It is important to note that, as shown in FIG. 4A, a pull-in voltage and a pull-out voltage can occur for both positive and negative force signals because the electrostatic force is proportional to the voltage squared. For example, there can be a positive pull-out voltage (Vpout+ 470), a positive pull-in voltage (Vpin+ 440), a negative pull-in voltage (Vpin− 420), and a negative pull-out voltage (Vpout− 430). In the absence of a retained surface charge, the profiles of each sweep should be centered around the zero point 405.

Returning to FIG. 3, after reaching the maximum signal (e.g., in embodiments which only perform the negative to positive/increasing voltage sweep—Steps 310 to 330) or reaching the minimum voltage (e.g., in embodiments that also perform the positive to negative/decreasing voltage sweep—Steps 340 to 360), the method 300/signal generator 210 may apply a stress signal to the MEMS capacitor 100 (Step 370). Applying the stress signal will inject a charge into the MEMS capacitor 100 that will be temporarily retained by the electrodes 110/130 and/or the surface coating 140 (e.g., the electrodes 110/130 and/or the surface coating 140 will retain a surface charge). The signal generator 210 may apply the stress signal for several minutes (e.g., 5 minutes, 10 minutes, 20 minutes, etc.). Any number of voltages may be used as the stress signal, however, the absolute value of the stress signal voltage should be below the pull-in voltages (e.g., Vpin− 420 and Vpin+ 440) of the MEMS capacitor to prevent the electrodes 110/130 from coming into contact with one another during the stressing process.

Various embodiments of the present invention can use either DC or AC voltages for the voltage sweep(s) and the stress signal. However, it is important to note that the average change in voltage for the voltage sweep(s) and stress signal should not equal zero. Therefore, AC voltages should be used in combination with a DC voltage to ensure that the average value in voltage is not equal to zero (e.g., it is either greater than or less than zero).

After applying the stress signal for the first time, the method 300 may repeat the steps of performing the voltage sweep (e.g., steps 310 to 330 or, alternatively, steps 310-360) and applying the stress signal (e.g., step 370) a number of times until a maximum number of times/cycles is performed (Step 380). It should be noted that any number of cycles/time can be performed. For example, the method 300 can perform the sweep/stress signal cycle two times, five times, ten times, or greater than ten times, to name but a few examples.

Figure 4B:
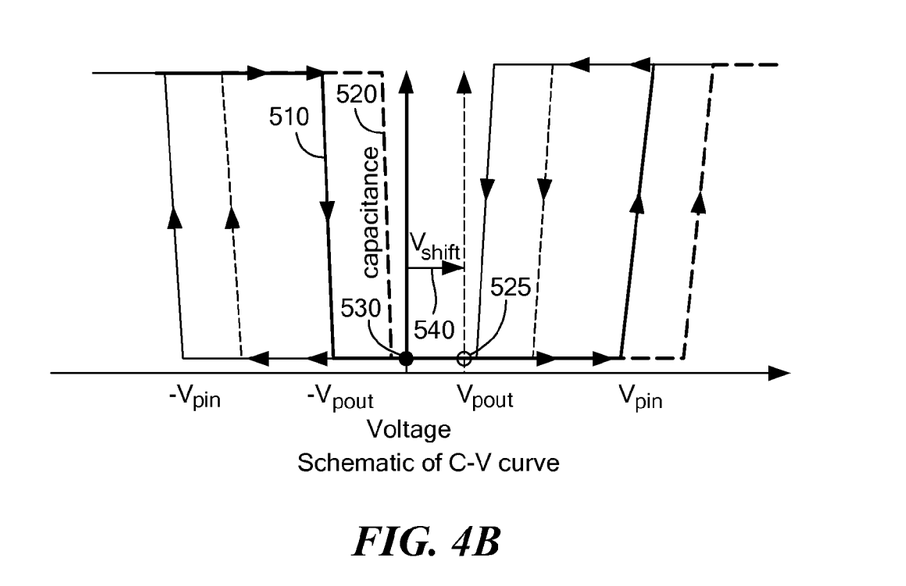

As mentioned above, applying the stress signal to the MEMS capacitor 100 will build up a surface charge within the electrodes 110/130 or the surface coating 140 of the electrodes 110/130. This built up surface charge will create a voltage shift in the MEMS capacitor 100. FIG. 4B shows a schematic of a C-V curve before and after a surface charge has built up within the MEMS capacitor 100 (e.g., after the signal generator 210 has applied the stress voltage). As can be seen in FIG. 4B, the C-V curve 520 is no longer centered around the zero point 405 (e.g., the point at which the voltage is zero). Rather, the built up surface charge creates a voltage shift which shifts the C-V curb left or right, depending on whether the retained charge is positive or negative. For example, FIG. 4B shows a typical C-V curve 510 (e.g., a C-V curve when there is no built-up surface charge), and a C-V curve 520 of a MEMS capacitor 100 in which there is a built up surface charge. As can be seen in the graph, the center point 525 of the C-V curve 520 is not centered at the zero point 530, whereas the center point of the typical C-V curve 510 is centered at the zero point 530. Instead, the built-up surface charge creates a voltage shift (Vshift) 540 that moves the center point 525 to the right of the zero point 530

It is important to note that the direction that the center of the C-V curve is shifted from the zero point 530 indicates whether the surface charge built up within the electrodes 110/130 or the surface coating 140 of the electrodes 110/130 is a positive charge or a negative charge. For example, a positive surface charge will shift the center point 525 in one direction, and a negative surface charge will shift the center point in the other direction.

Returning to FIG. 3, once the maximum number of cycles is performed (determined on a case by case basis and based upon the given application), the method 300 (e.g., the signal monitor 220) can record the results and send them to the data analyzer 230 (step 390). As discussed in greater detail below, the data analyzer 230, in turn, can analyze the results and characterize the amount of surface charge (e.g., the voltage shift) retained by the MEMS capacitor 100. For example, the charge at a given applied voltage is proportional to the applied voltage and the measured capacitance at that voltage. Therefore, the data analyzer 230 can determine a charge at a given applied voltage utilizing the following equation:

$$Q = C \times V$$

where Q is the magnitude of the charge, C is the measured capacitance, and V is the voltage (e.g., the voltage shift).

To determine the retained charge, the data analyzer 230 can determine the change in retained charge for a given applied voltage (e.g., for a given applied force signal). For example, the data analyzer 230 can determine the charge for a given applied force signal during the initial voltage sweep (e.g., before the stress signal is applied) and then again during the subsequent voltage sweeps (e.g., after the stress signal is applied). The amount of the charge at a given applied voltage is equal to the absolute value of the voltage shift caused by the retained charge. As described in greater detail below, the calculated retained charge (e.g., voltage shift) may then be stored (e.g., within a look-up table) for use during device operation to allow the system (e.g., a control circuit) to compensate for the retained charge.

Perhaps a simple example to illustrate the change in retained charge is when the applied voltage is zero (e.g., when the signal generator is not applying any voltage and any charge is the result of the built-up/retained surface charge). In this example, prior to the stress signal being applied (e.g., during the initial voltage sweep), there should be no retained charge. Therefore, the charge at zero applied voltage should also be zero (e.g., the center of the hysteresis plot is located at the zero voltage point—see C-V curve 510 in FIG. 4B). However, once the signal generator 210 applies the stress signal and a charge is built-up/retained within the electrodes 110/130, the calculated charge will no longer be zero (e.g., because of the built-up/retained charge). This change in the calculated charge can be seen as a shift in the center point of the hysteresis plots (e.g., from the zero point 530 to point 535, as discussed above).

As mentioned above, some embodiments can optionally perform both an increasing voltage sweep (e.g., a voltage sweep that increases the applied voltage from a minimum voltage to a maximum voltage) and a decreasing voltage sweep (e.g., a voltage sweep that decreases the applied voltage from the maximum down to the minimum voltage). In such embodiments, the data analyzer 230 can determine the voltage shift for the increasing voltage sweep, and the voltage shift for the decreasing voltage sweep. Although the increasing and decreasing voltage sweeps span the same voltage range (e.g., they both have the same minimum and maximum voltages), the calculated voltage shifts may vary slightly. Therefore, in order to obtain a single voltage shift, various embodiments may average the voltage shifts calculated for the increasing and decreasing voltage sweeps. This average voltage shift can then be used characterize the retained charge and may be stored within the look up table (e.g., as mentioned above and discussed in greater detail). Also, some embodiments can perform additional voltage sweeps (e.g., in addition to the increasing and decreasing voltage sweeps discussed above) and average the calculated voltage shifts for all sweeps (e.g., the signal generator can perform multiple increasing voltage sweeps and multiple decreasing voltage sweeps that can be averaged to obtain a single voltage shift).

It is important to note that, because the voltage shift (e.g., the retained charge) is proportional to the stress signal and the amount of time the stress signal is applied to the MEMS capacitor (e.g., the voltage and length of time the stress signal is applied will determine the amount of retained voltage and the voltage shift), some embodiments can vary the stress voltage and time. For example, after each voltage sweep, the signal generator 210 can use a different stress voltage and/or apply the stress voltage for a different length of time (e.g., for subsequent cycles). In this manner, some embodiments of the present invention are able to obtain numerous data points for the retained charge which, in turn, provides for better calibration and compensation for the retained charge (discussed below). The calculated voltage shift (e.g., the retained charge) for each of the applied stress signals can be stored within a look up table.

Once the built-up/retained surface charge is determined (e.g., the look up table is populated), some embodiments of the present invention can then use this information to calibrate the MEMS capacitors (e.g., the accelerometers, gyroscopes, etc.) in order to compensate for the retained charge. For example, some embodiments can include a control circuit that alters the amount of voltage used to energize the capacitor during use in order to compensate for the retained charge. In other words, the control circuit can monitor the working stress voltage and adjust the input used to energize the capacitor during operation based upon the calculated voltage shift at the working stress voltage (e.g., the control circuit can utilize the look up table to determine the voltage shift at a given working stress voltage and adjust the voltage input accordingly).

For example, the control circuit can increase or decrease the input voltage to off-set the anticipated retained charge, and essentially shift the C-V curve back to the typical C-V 510 curve shown in FIG. 4B. The control circuit can continuously monitor the working stress voltage and adjust the input voltage (e.g., using the look up table) as the working stress voltage changes. For example, in some embodiments, the desired/target energizing voltage can be equal to the applied input voltage plus the retained charge (e.g., the voltage may be equal to the voltage supplied to the MEMS capacitor plus the charge/voltage that is retained in the surface of the electrodes 110/130).

By compensating for the retained surface charge in the manner described above, embodiments of the present invention are able to provide a higher degree of accuracy (e.g., because the retained charge is being compensated for). Additionally, compensating for the retained charge can improve the range of stable operation, reduce performance drift with time, and reduce the likelihood of stiction (which, in turn, may lead to device failure). Furthermore, because the retained voltage dissipates over time, embodiments of the present invention are able to characterize the retained charge without destroying the MEMS capacitor 100.

Additionally, because the retained charge is representative of a charge that builds-up in the surface of the electrodes 110/130 and/or any coatings 140 on the electrodes 110/130, some embodiments of the present invention can be used to test and compare a number of different surface coatings. For example, various embodiments of the present invention can be used to compare a variety of different anti-stiction and/or dielectric material coatings. Based upon the information generated utilizing the above described methodology, the most appropriate surface coating (or no surface coating) can be determined for a given application for the MEMS device 100.

It is important to note that, during MEMS device fabrication, several of the test chips 200 can be manufactured on specific portions of a wafer. For example, the test chip 200 can be manufactured on approximately ten dies spaced throughout a wafer containing several thousand MEMS devices. In this manner, there is only minimal cost in real estate (e.g., adding the test chips 200 does not greatly reduce the number of accelerometers, gyroscopes, etc. that may be manufactured). Because the MEMS devices surrounding the test chip 200 should have similar charge retention characteristics, each test chip 200 can be used to characterize the retained charge of MEMS devices surrounding the test chip 200 (e.g., before the wafer is diced).

Additionally, although the embodiments described above are described as being on-chip devices (e.g., the signal generator 210 and the signal monitor 220 may be located on the same chip as the MEMS capacitor 100), the above described components (e.g., the signal generator 210, signal monitor 220, and data analyzer 230) can also be located off chip. For example, the signal generator 210, the signal monitor 220, and the data analyzer 230 may be separate from the MEMS capacitor 100, and electrically connected to the MEMS capacitor 100 after manufacture.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method for measuring a retained surface charge within a MEMS device comprising:

(i) performing an initial voltage signal sweep on the MEMS device, the MEMS device including a first and second electrode; the initial voltage signal sweep including applying a first force voltage signal to a substrate and the second electrode of the MEMS device and gradually changing the applied first force voltage signal, which changes a capacitance between the first and second electrode;

(ii) applying a stress voltage signal to the MEMS device for a pre-determined amount of time, the stress voltage signal causing at least one of the first and second electrodes to retain a surface charge;

(iii) performing an at least one additional voltage signal sweep on the MEMS device after applying the stress voltage signal, the at least one additional voltage signal sweep including applying a second force voltage signal to the MEMS device and gradually changing the applied second force voltage signal, changing the second force voltage signal which changes the capacitance between the first and second electrode;

(iv) calculating a signal shift based upon data obtained in (i) and (iii), the signal shift being representative of the retained surface charge.

2. A method according to claim 1, wherein performing the initial voltage signal sweep and the at least one additional voltage signal sweep includes increasing the applied first force voltage signal and applied second force voltage signal from a minimum signal to a maximum signal.

3. A method according to claim 2, wherein performing the initial voltage signal sweep also includes decreasing the applied first force voltage signal to the minimum signal after reaching the maximum signal, and performing the at least one additional voltage signal sweep includes decreasing the applied second force voltage signal to the minimum signal after reaching the maximum signal.

4. A method according to claim 3, wherein calculating a voltage signal shift includes:
calculating a first voltage signal shift based upon data obtained as the applied second force is increased during the at least one additional voltage signal sweep;
calculating a second voltage signal shift based upon data obtained as the applied second force is decreased during the at least one additional voltage signal sweep; and
averaging the first and second voltage signal shifts to obtain an average voltage signal shift.

5. A method according to claim 1, wherein at least one of the first and second electrodes includes a coating, the surface charge being retained in the coating.

6. A method according to claim 5, wherein the coating is at least one of an anti-stiction coating and a dielectric material coating.

7. A method according to claim 1, wherein an absolute value of the stress voltage signal is less than a pull-in voltage of the first and second electrodes.

8. A method according to claim 1, wherein performing the initial voltage signal sweep and the at least one additional voltage signal sweep includes decreasing the applied first voltage signal and applied second voltage signal from a maximum signal to a minimum signal.

9. A method according to claim 8, wherein performing the initial voltage signal sweep also includes increasing the applied first force voltage signal to the maximum signal after reaching the minimum signal, and performing the at least one additional voltage signal sweep includes increasing the applied second force voltage signal to the maximum signal after reaching the minimum signal.

10. A method according to claim 9, wherein calculating a voltage signal shift includes: calculating a first voltage signal shift based upon data obtained as the applied second force is decreased during the at least one additional voltage signal sweep; calculating a second voltage signal shift based upon data obtained as the applied second force is increased during the at least one additional voltage signal sweep; and averaging the first and second voltage signal shifts to obtain an average voltage signal shift.

11. A method for characterizing surface charges within a MEMS device having a first and second electrode, the method comprising:
(i) applying a force voltage signal to a substrate and the second electrode of the MEMS device, the force voltage signal creating a capacitance between the first and second electrode;
(ii) gradually changing the applied force voltage signal to change the capacitance between the first and second electrodes;
(iii) applying a stress voltage signal to the MEMS device for a pre-determined amount of time, the force voltage signal causing at least one of the first and second electrodes to retain a surface charge;
(v) repeating (i) through (iii) for a pre-determined number of times;
(vi) calculating a signal shift based upon data obtained in (ii), the signal shift being representative of the retained surface charge.

12. A method according to claim 11, wherein at least one of the first and second electrodes includes a coating, the surface charge being retained in the coating.

13. A method according to claim 12, wherein the coating is at least one of an anti-stiction coating and a dielectric material coating.

14. A method according to claim 11, wherein an absolute value of the stress voltage signal is less than a pull-in voltage of the first and second electrodes.

15. A method according to claim 11, wherein calculating a voltage signal shift includes plotting the change in capacitance against the applied signal data to obtain a hysteresis plot for each of the pre-determined number of times, the voltage signal shift being the distance of a center point of the hysteresis plot from a zero signal point.

16. A method according to claim 11, wherein gradually changing the force voltage signal includes increasing the force voltage signal to a maximum signal.

17. A method according to claim 16 further comprising: gradually decreasing the applied force voltage signal once the force voltage signal has reached the maximum signal.

18. A method according to claim 17, wherein calculating a voltage signal shift includes: calculating a first voltage signal shift based upon data obtained as the applied force voltage signal is increased; calculating a second voltage signal shift based upon data obtained as the applied force voltage signal is decreased; and averaging the first and second voltage signal shifts to obtain an average voltage signal shift.

19. A method according to claim 11, wherein repeating (i) through (iii) for a pre-determined number of time including repeating (i) through (iii) at least five times, the stress signal and pre-determined amount of time being varied for each of the number of times.

20. A method according to claim 19, further comprising calculating a voltage signal shift for each of the predetermined number of times.

21. A test system comprising:
a MEMS capacitor having a first electrode and a second electrode, the first and second electrode being separated by an air gap;
a signal generator configured to perform at least one signal voltage sweep and apply a stress voltage signal to the MEMS capacitor, the signal sweep including applying and gradually changing a force voltage signal to the MEMS capacitor thereby changing a capacitance between the first and second electrode, the stress signal causing at least one of the first and second electrodes to retain a surface charge, the signal generator applying the stress signal to the MEMS device for a pre-determined amount of time;

a signal monitor configured to measure the capacitance between the first and second electrode as the applied force voltage signal is increased, the signal monitor configured to communicate with a data analysis device configured to calculate a signal shift based, at least in part, upon the applied force signal and the capacitance measured by the signal monitor, the signal shift being representative of the retained surface charge.

22. A test system according to claim 21, wherein the MEMS capacitor, the signal generator, and the signal monitor are located on the same chip.

23. A test system according to claim 21, wherein at least one of the first and second electrodes includes a coating, the surface charge being retained in the coating.

24. A test system according to claim 23, wherein the coating is at least one of an anti-stiction coating and a dielectric material coating.

25. A test system according to claim 21, wherein the voltage signal sweep is an increasing voltage signal sweep, the signal generator gradually increasing the applied force voltage signal to a maximum signal.

26. A test system according to claim 25, wherein the voltage signal generator is also configured to perform a decreasing voltage signal sweep by gradually decreasing the applied force voltage signal once the force voltage signal has reached the maximum signal, and the signal monitor is configured to measure the capacitance between the first and second electrodes during the decreasing voltage signal sweep.

27. A test system according to claim 21, further comprising the data analysis device.

* * * * *